United States Patent [19]
Juan

[11] Patent Number: 5,642,382
[45] Date of Patent: Jun. 24, 1997

[54] FIR FILTERS WITH MULTIPLEXED INPUTS SUITABLE FOR USE IN RECONFIGURABLE ADAPTIVE EQUALIZERS

[75] Inventor: Yujen Juan, Princeton Junction, N.J.

[73] Assignee: Hitachi America, Ltd., Tarrytown, N.Y.

[21] Appl. No.: 396,839

[22] Filed: Mar. 1, 1995

[51] Int. Cl.$^6$ ...................................................... H03H 7/30
[52] U.S. Cl. ........................... 375/232; 375/233; 375/321; 364/724.2; 348/725
[58] Field of Search ........................... 375/229, 230, 375/232, 233, 235, 261, 266, 270, 277, 321, 340, 343, 346, 348, 350; 364/724.19, 724.03, 724.2, 572; 329/310, 349, 350, 353, 357; 455/109, 334, 204; 333/28 R; 348/724

[56] References Cited

U.S. PATENT DOCUMENTS

| | | | |
|---|---|---|---|
| 4,852,035 | 7/1989 | Mitchner | 364/724.1 |
| 5,363,408 | 11/1994 | Paik et al. | 375/261 |
| 5,367,476 | 11/1994 | Elliott | 364/724.01 |
| 5,381,357 | 1/1995 | Wedgwood | 364/724.16 |
| 5,398,073 | 3/1995 | Wei | 348/487 |
| 5,483,529 | 1/1996 | Baggen et al. | 370/70 |
| 5,493,343 | 2/1996 | Knutson et al. | 348/691 |
| 5,506,636 | 4/1996 | Patel et al. | 348/725 |
| 5,550,596 | 8/1996 | Strolle et al. | 348/607 |

Primary Examiner—Wellington Chin
Assistant Examiner—William Luther
Attorney, Agent, or Firm—Michaelson & Wallace; Michael P. Straub; Peter L. Michaelson

[57] ABSTRACT

Methods and apparatus for providing implementation efficient adaptive equalizers suitable for use with QAM and/or VSB signals are disclosed. Finite impulse response ("FIR") filters are used to implement the disclosed adaptive equalizers. A plurality of arithmetic operator sharing techniques are disclosed for reducing the number of arithmetic operators required to implement the adaptive equalizers. In addition, methods of reconfiguring the arithmetic operators used to implement a QAM equalizer so that they can be used to implement a VSB equalizer circuit are disclosed. Methods of the present invention use multiplexers to reconfigure the FIR filters from a complex decimating FIR filter for use during QAM operation, to a half complex feedforward FIR filter and a real decision feedback FIR filter suitable for use during VSB mode operation of the equalizer circuit of the present invention. Using the methods of the present invention it is possible to implement a 256-tap FIR filter using only 64 sets of arithmetic operators. The adaptive equalizer of the present invention may be used in a demodulator for demodulating QAM and/or VSB signals.

15 Claims, 9 Drawing Sheets

FIR FILTERS WITH MULTIPLEXED INPUTS SUITABLE FOR USE IN RECONFIGURABLE ADAPTIVE EQUALIZERS

FIELD OF THE INVENTION

The present invention is directed to methods and apparatus for the efficient implementation of adaptive equalizers, and more specificly to implementation efficient FIR filters for use in, e.g. vestibule side band (VSB) and/or quadrature amplitude modulated (QAM) equalizer circuits.

BACKGROUND OF THE INVENTION

The use of quadrature amplitude modulation ("QAM") and vestigial sideband ("VSB") modulation for transmitting data, such as high definition television ("HDTV") signals, is growing in popularity.

In the United States, HDTV systems, which include, e.g., Advanced television ("ATV") systems, appear to be headed in two different directions with regard to the type of modulation used to transmit television signals.

At present, cable companies in the United States are preparing to transmit HDTV digital signals over cable using a QAM technique of data transmission.

On the other hand, the terrestrial television industry in the U.S. is planning to broadcast digital HDTV, e.g., ATV signals, using a Vestigial SideBand ("VSB") technique of data transmission proposed by Zenith corporation/Grand Alliance.

Accordingly, to be capable of receiving and displaying both cable and terrestrial HDTV television transmissions, a television receiver will have to be capable of receiving and demodulating both QAM and VSB HDTV signals.

Because equalizer circuitry constitutes a major component of a demodulator, there is therefor a need for equalizer circuitry that can be used as part of a demodulator for demodulating either QAM or VSB signals.

Furthermore, so that the equalizer can be implemented at a reasonable cost, it is highly desirable that such an equalizer be capable of being implemented using a single common set of hardware that is used in both QAM and VSB modes of operation.

SUMMARY OF THE INVENTION

The present invention is directed to methods and apparatus for the efficient implementation of adaptive equalizers suitable for use in a demodulator capable of demodulating VSB and/or QAM signals.

In particular, as will be discussed in detail below, the present invention is directed to circuitry for redirecting the input signals of an equalizer and the arithmetic operators, e.g., adders and multipliers used in an equalizer, to maximize the amount of circuitry that can be used in both VSB and QAM modes of equalizer operation.

In order to optimize the amount of common circuitry in a joint VSB/QAM equalizer between VSB and QAM modes, in accordance with the present invention, the arithmetic operators, e.g., adders and multipliers, required to implement a VSB equalizer and a QAM equalizer, are shared thereby achieving significant hardware savings as compared to embodiments which do not share such circuitry.

In accordance with one embodiment of the present invention the arithmetic operators of the VSB/QAM equalizer are designed to be reconfigurable so that during VSB mode operation arithmetic operators used to process the imaginary part of the QAM signal can be used to perform a portion of the arithmetic operations associated with processing a real VSB signal.

To further reduce hardware requirements, the FIR filters used to implement the equalizer of the present invention are designed so that a single set of arithmetic operators can be used to implement multiple taps of a FIR filter thereby eliminating the need for a separate set of arithmetic operators for each tap of the FIR filters used in accordance with the present invention.

Various additional features of the present invention are described in the detailed description set forth below.

DETAILED DESCRIPTION

Figure 1:
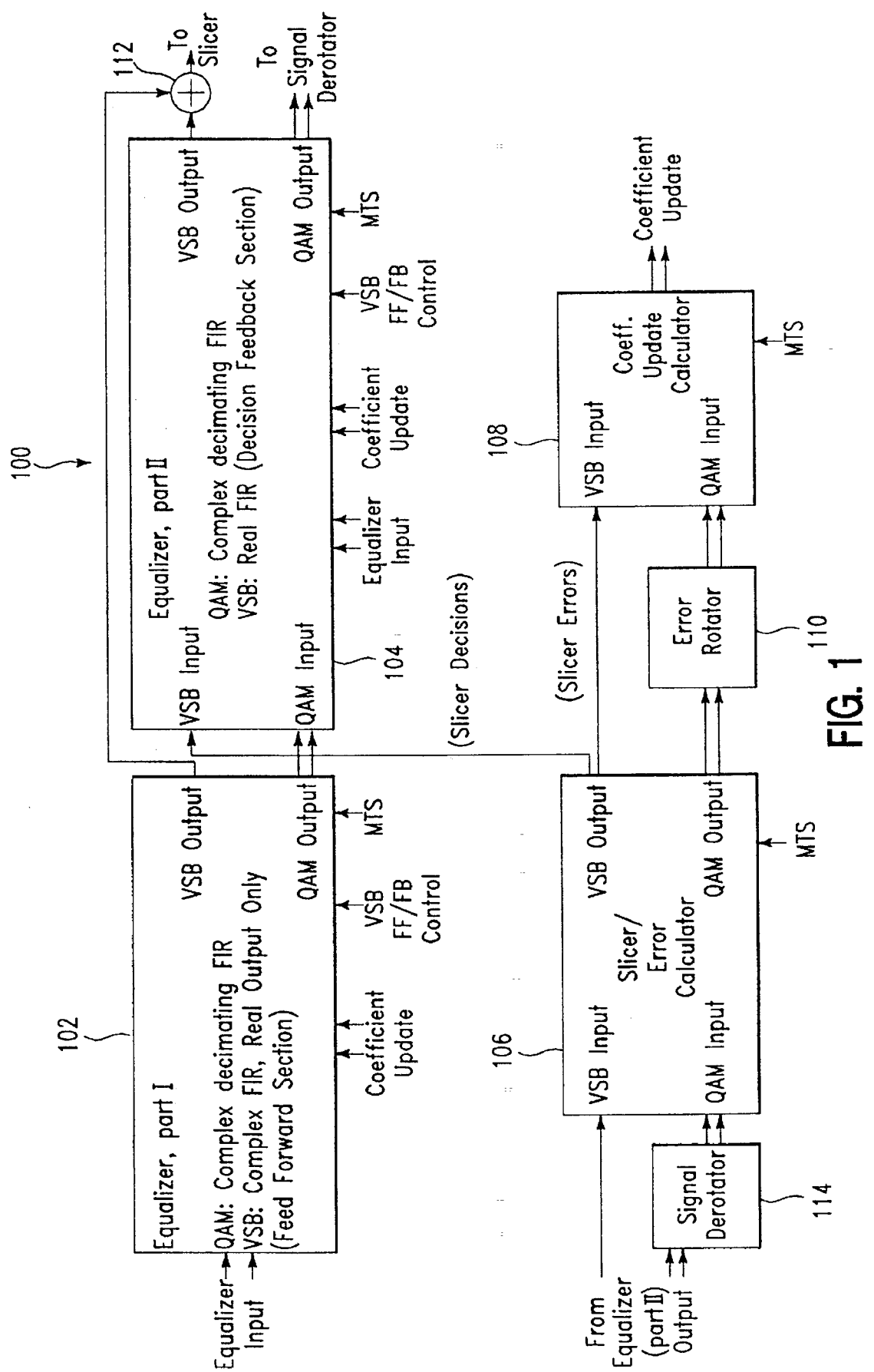
FIG. 1 is a schematic block diagram of a joint VSB/QAM equalizer implemented in accordance with one embodiment of the present invention.

The present invention is directed to methods and apparatus for the efficient implementation of adaptive equalizers and adaptive equalizer filter circuitry suitable for use in a demodulator capable of demodulating VSB and/or QAM signals.

In particular, as will be discussed in detail below, the present invention is directed to circuitry for redirecting the input signals of an equalizer and the arithmetic operators, e.g., adders and multipliers used in an equalizer, to maximize the amount of circuitry that can be used in both VSB and QAM modes of equalizer operation.

In accordance with the present invention, equalization is performed in both VSB and QAM modes using FIR filters with time varying coefficients. While the filter configuration and gain may be different between QAM and VSB modes of operation, in accordance with one embodiment of the present invention, the same coefficient updating algorithm is used for both VSB and QAM modes of operation. Thus, even though the gain of the filters used to implement an equalizer such as the VSB/QAM equalizer 100 may be very different depending on whether the equalizer 100 is operating in a VSB or QAM mode, the same hardware can be used to perform the update of the filter coefficient values regardless of the mode of operation.

As will be discussed in greater detail below, when operating in QAM mode, the VSB/QAM equalizer 100 of the present invention operates as a complex filter operating at, e.g., a sampling rate that is four times the QAM signal's symbol rate. During VSB mode, the VSB/QAM equalizer 100 operates as a real filter operating at, e.g., two times the VSB symbol rate which is approximately twice the QAM symbol rate. Four example, if the QAM symbol rate is 5 MHz, and the VSB symbol rate approximately 10 MHZ, the equalizer 100 of the present invention may operate at, e.g., a rate of 20 MHz.

In order to optimize the amount of common circuitry between VSB and QAM modes, in accordance with the present invention, the arithmetic operators, e.g., adders and multipliers, required to implement a VSB equalizer and a QAM equalizer, are shared thereby achieving significant hardware savings as compared to embodiments which do not share such circuitry. In particular, the arithmetic operators of the VSB/QAM equalizer 100 are designed to be reconfigurable so that during VSB mode operation arithmetic operators used to process the imaginary part of the QAM signal can be used to perform arithmetic operations associated with processing the real VSB signal.

While the present invention utilizes a great deal of common circuitry in VSB and QAM modes of operation, separate hardware is used for the calculation of the coefficient update values for each mode of operation. In addition, additional hardware not needed to implement independent VSB and QAM equalizer circuits, e.g., MUXes, are used to reconfigure the equalizer of the present invention between VSB and QAM equalizer modes of operation. As will be discussed below, the reconfiguring of the VSB/QAM equalizer 100 of the present invention is achieved by using, e.g., multiplexers ("MUXes"), to redirect the inputs to the equalizer's FIR filters and the arithmetic operators used to implement the equalizer 100.

Referring now to FIG. 1, there is illustrated a schematic block diagram of the joint VSB/QAM equalizer 100, capable of operating in either a VSB or QAM mode of operation, implemented in accordance with one embodiment of the present invention.

The VSB/QAM equalizer 100 comprises first and second equalizer circuits identified in FIG. 1, as equalizer part I 102 and equalizer part II 104, a summer 112, a signal derotator 114, a slice/error calculation circuit 106, an error rotator 110 and a coefficient update calculation circuit 108. The various circuits of the VSB/QAM equalizer 100 are coupled together as illustrated in FIG. 1 and as discussed below.

The first equalizer circuit 102 operates as a complex decimating FIR filter during QAM mode operation with complex QAM signal outputs which are coupled to corresponding inputs of the second equalizer circuit 104. However, during VSB mode operation, the first equalizer circuit 102 is configured to operate as the feed forward section of a VSB equalizer and only the real output signal from the first equalizer circuit 102 is used. In such a case, a real VSB signal output is supplied to a first input of the summer 112.

As illustrated in FIG. 1, the first and second equalizer circuits 102, 104 receive as their input an equalizer input signal from, e.g., a Nyquist filter, and a coefficient update signal from the coefficient update calculation circuit 108. In addition, the first equalizer circuit 102, like the second equalizer circuit 104, slice/error calculation circuit 106 and coefficient update calculation circuit 108, receives a modulation type selection (MTS) signal as an input. The MTS signal indicates whether the VSB/QAM equalizer 100 should operate in a VSB or QAM mode. The circuits 102, 104, 106, 108 receiving the MTS signal are responsive thereto to operate in either the indicated VSB or QAM mode.

The MTS signal may be supplied by, e.g., an automatic VSB/QAM detection circuit, such as the one disclosed in U.S. Pat. application Ser. No. 08/354,303, filed on Dec. 13, 1994 and hereby expressly incorporated by reference.

A VSB feed forward/feedback (FF/FB) control signal is supplied to both the first and second equalizer circuits 102, 104. The signal is used to control the first and second equalizer circuits 102, 104 so that they are configured as feed forward and feedback sections, respectively, of the equalizer 100 when operating in VSB mode. Accordingly, this signal controls the first and second equalizer circuits 102, 104 which, in accordance with the present invention, may be implemented using identical hardware.

The second equalizer circuit 104 receives as its inputs the equalizer input signal, the coefficient update signal, the VSB FF/FB control signal, the MTS signal, the complex QAM signal output by the first equalizer circuit 102 and a VSB output signal output by the slicer/error calculation circuit 106.

During QAM mode, the second equalizer circuit 104 operates as a complex decimating FIR filter while during VSB mode it operates as a real FIR filter to serve as the decision feedback section of a VSB equalizer.

A complex QAM output of the second equalizer circuit 104 is coupled to a corresponding input of the signal derotator circuit 114 while a real VSB signal output is coupled to a second input of the summer 112.

The summer 112 sums the real VSB signals output by the first and second equalizer circuits 102, 104 to generate a signal which is supplied to a VSB signal input of the slicer/error calculation circuit 106.

A complex QAM signal output of the signal derotator 114 is coupled to a corresponding QAM signal input of the slicer/error calculation circuit 106. Thus, the slicer/error calculation circuit 106 receives either a real VSB signal output by the summer 112 or a complex QAM signal output by the signal derotator 114 depending on the mode of operation.

The slicer/error calculation circuit 106 is used to slice the output of the second equalizer circuit 104 into discrete levels. It is the decision device used in determining the most likely transmitted symbol from the transmitter. In addition, it also calculates the error between the equalizer output and the decided symbol. The slicer/error calculation circuit 106 has a VSB slicer decision value output coupled to a corresponding VSB input of the second equalizer circuit 104. The slicer decision value output is used only for VSB mode operation where it is used by the second equalizer circuit 104 when operating as a decision feedback section of a VSB equalizer.

A VSB slice error signal output of the slicer/error calculation circuit 106 is coupled to a corresponding VSB input of the coefficient update calculation circuit 108. In addition, a complex QAM error signal output is coupled to a corresponding complex input of the error rotator 110. The error rotator 110, in turn, has a complex QAM output coupled to a corresponding input of the coefficient update calculation circuit 108.

The coefficient update calculation circuit 108 calculates the filter coefficient update values to be used by the first and second equalizer circuits 102, 104 from the received slice error signals and supplies coefficient update signals thereto to adjust the filter coefficients as required. In the case of VSB mode operation, the coefficient update signal to the decision feedback section, i.e., the second equalizer circuit 104 when operating in VSB mode, is a real as opposed to complex signal.

Since the gain and the error used in the coefficient update algorithm calculation, used to calculate the filter coefficients for the first and second equalizer circuits 102, 104 may be different for QAM and VSB modes, they can be calculated outside of the first and second equalizer circuit 102, 104 even though the coefficients will, in accordance with the present invention, be updated by the first and second equalizer circuits 102, 104 using the same least means square (LMS) algorithm in both VSB and QAM modes of operation.

In accordance with the present invention, the first and second equalizer circuits 102, 104 receive the coefficient update signals, e.g., values, calculated by the coefficient update calculation circuit 108. The first and second equalizer circuits 102, 104 take the coefficient update values supplied by the coefficient update calculation circuit 108 and update their filter coefficients using the LMS algorithm implemented along with the FIR filters in the first and second equalizer circuits 102, 104.

While in FIG. 1, the inputs and outputs of the VSB/QAM equalizer circuit elements are drawn separately for VSB and QAM signals, the inputs and outputs can be shared as the VSB/QAM equalizer 100 operates in either VSB or QAM modes thereby eliminating the need to have physically distinct input and output signal paths for QAM and VSB modes of operation.

The VSB/QAM equalizer 100 of the present invention will now be described in greater detail with reference to FIGS. 2 and 3 which are schematic block diagrams representing the VSB/QAM equalizer 100 when it is configured to operate in QAM and VSB modes of operation, respectively.

Figure 2:
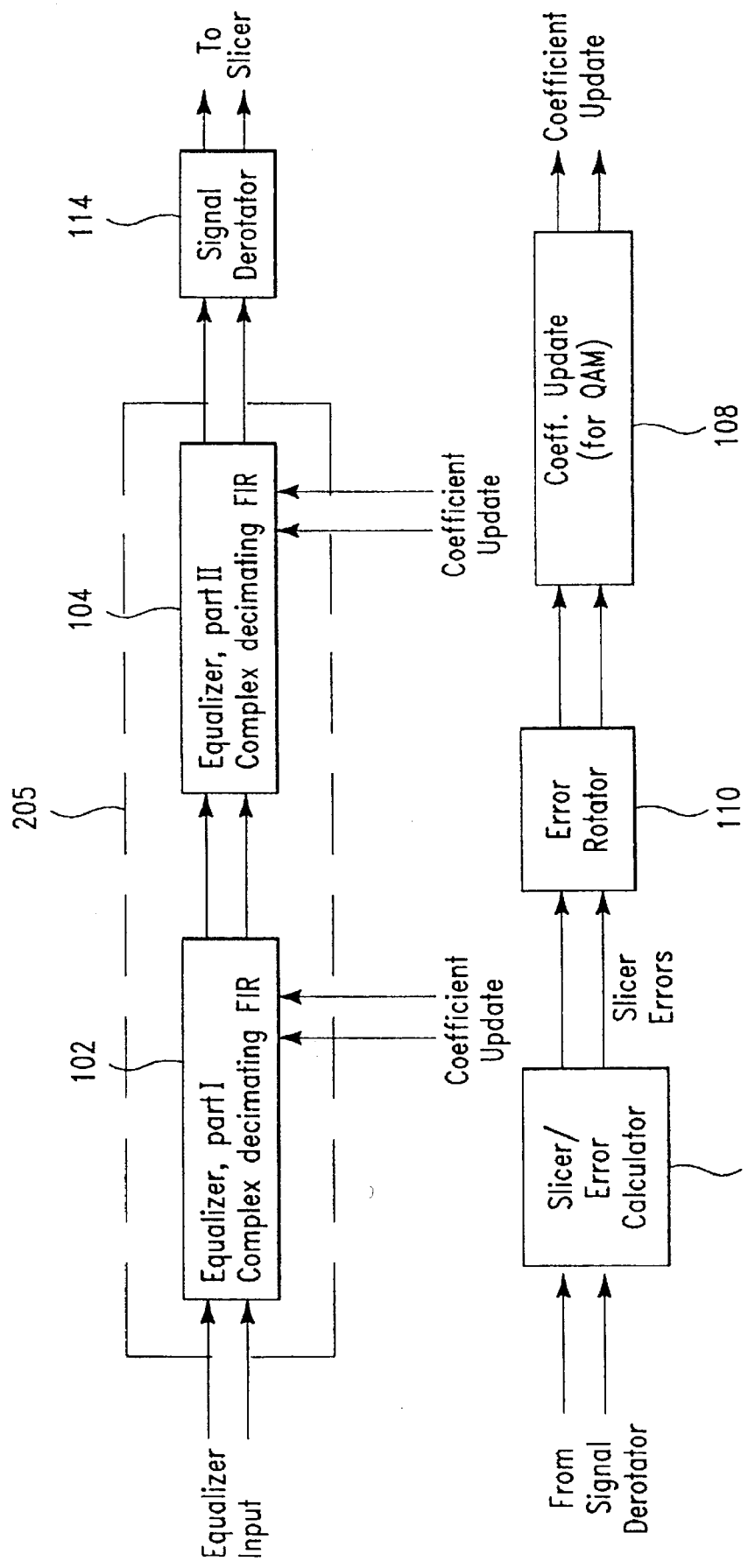
FIG. 2 is a block diagram of the equalizer illustrated in FIG. 1 when configured to operate in a QAM mode of operation.

Referring now to FIG. 2, there is illustrated a block diagram representation of the VSB/QAM equalizer 100 as configured to operate in QAM mode. The various QAM signal connections between the circuit elements of FIG. 2 were described above in regard to FIG. 1.

In QAM mode, the VSB/QAM equalizer 100 operates as a fractionally spaced equalizer with the input data rate being at, e.g., twice the QAM symbol rate and the output data rate being at the QAM symbol rate. In the case of a QAM HDTV signal, the QAM symbol rate may be approximately 5 Msamples/sec.

In QAM mode, the first and second equalizer circuits 102, 104 operate together as a single complex decimating FIR filter 205. Thus, when cascaded together in QAM mode, both equalizer filter circuits 102, 104 operate together as one complex decimating filter 205 with an input data rate of twice the QAM signal's symbol rate and an output data rate equal to the QAM signal's symbol rate.

Note that the equalizer circuits 102, 104 perform the equalization in the passband during QAM mode. However, the slicer/error calculation circuit 106 operates in the baseband, so the signal derotator 114 and error rotator 110 are needed when operating in QAM mode. If, during QAM mode, the equalizer 100 performed the equalization at baseband, than neither the signal derotator circuit 114 nor the slice/error calculation circuit 106 would be required.

Figure 3:
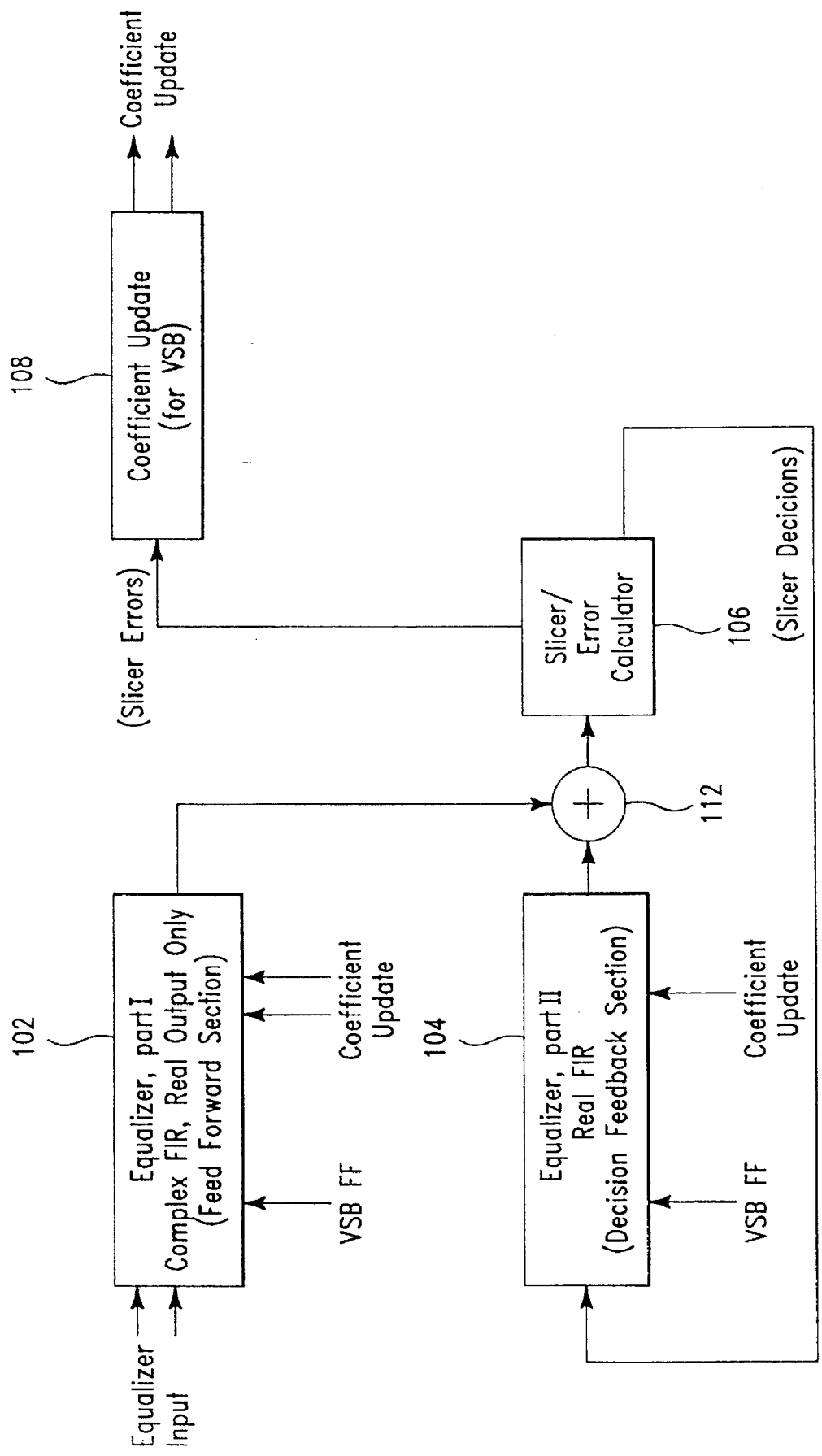
FIG. 3 is a schematic block diagram of the equalizer illustrated in FIG. 1 when configured to operate in a VSB mode of operation.

Referring now to FIG. 3, there is illustrated a block diagram representation of the VSB/QAM equalizer 100 as configured to operate in VSB mode. The various VSB signal connections between the circuit elements of FIG. 3 were described above in regard to FIG. 1.

Referring now to FIG. 3, in VSB mode, the VSB/QAM equalizer 100 operates as a FIR filter with an input sampling rate equal to the output sampling rate. Thus, in VSB mode, both the inputs and outputs of the VSB/QAM equalizer 100 operate at the same sampling rate which is, e.g., the VSB signal's symbol rate. In the case of VSB HDTV signals, it is expected that the VSB symbol rate will be about 10 Msamples/sec which is about twice the symbol rate (5 Msamples/sec) which is expected to be used for QAM HDTV signals.

The VSB and QAM mode, of equalizer operation differ not only in the use of filtering, e.g., real as opposed to complex, but in the actual configuration of the equalizer filter, i.e., the first and second equalizer circuits 102, 104. While in QAM mode, the first and second equalizer circuits 102, 104 operate together to act as a single complex decimating filter 205, during VSB mode operation, the first and second equalizer circuits 102, 104 operate as two distinct filter circuits corresponding to a feedforward section 102, and a decision feedback section 104.

The feedforward section 102, like the QAM complex decimating filter circuit 205, receives complex samples and complex coefficients as input signals. However, during VSB mode only the real part of the output samples are used, i.e., the imaginary part is not used.

As illustrated, the second equalizer circuit 104, when operating as a decision feedback section of the VSB/QAM equalizer 100 in VSB mode, takes its input from the decision output of the slicer/error calculation circuit 106, so it operates as a real filter having real samples and real coefficients as inputs.

While the complex FIR filter 102 is described as being used as the feedforward section of the VSB/QAM equalizer 100 while operating in VSB mode, it is possible to use a filter with only real inputs and real coefficients for both the feed forward and feedback sections of the equalizer 100 during VSB mode operation.

As illustrated, the summer 112, which is not used during QAM mode, is required to sum the output of the feed forward section 102 and the decision feedback section 104 of the equalizer 100 when operating in VSB mode to generate the input signal supplied to the slicer/error calculation circuit 106.

Figure 4:
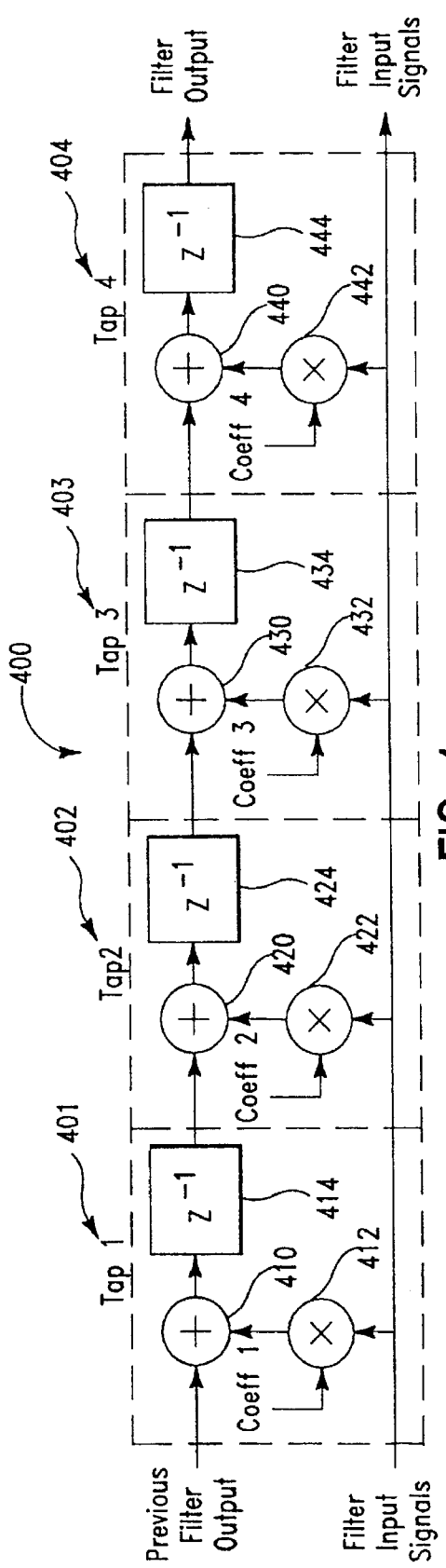
FIG. 4 is a Z-transform representation of a 4-tap finite impulse response (FIR) filter.

Referring now to FIG. 4, there is illustrated a signal flow graph for a 4-tap FIR filter 400. The format of the illustration of FIG. 4, is commonly called the transposed form of an FIR filter. The 4-tap FIR filter 400 comprises 4 taps or cells, i.e., tap 1 401, tap 2 402, tap 3 403 and tap 4 404. Each one of the four taps 401, 402, 403 and 403 comprises the same three basic elements a multiplier 412, a summer 410 and a unit delay element 414, 424, 434, 444. Furthermore, each tap 401, 402, 403, 404 is constructed in the same manner as the other taps.

Referring now to tap 1 401, which is exemplary of the of the taps 401, 402, 403, 404, it can be seen that the multiplier 412 receives as a first input, a sample from the filter input samples supplied to the 4-tap FIR filter 400, and receives, as a second input, a filter coefficient for the tap 401, i.e., coeff. 1. The multiplier 412 multiplies the input sample and coeff. 1 to generate an output signal which serves as a first input to the summer 410. A second, e.g., previous filter tap, input of the summer 410 is coupled to the output of a previous filter tap or ground. The previous filter tap input is coupled to ground (zero) in the event that tap 1 401 is not coupled to the output of a previous filter, e.g., if it is the first tap of an N tap FIR filter where N is an integer.

The summer 410 sums the output of the multiplier 412 and the previous filter tap, if any, to generate a signal which is supplied to the unit delay element 414. The unit delay element 414 generates the output of the first tap 1 401 and is coupled to the previous filter tap input of the next tap, tap 2 402, of the 4-tap FIR filter 400.

The transposed form of an FIR filter illustrated in FIG. 4, has the advantages of regularity and hence is easily cascadable. Two filters, in transposed form, can be easily connected together to form a longer filter. Alternatively, such a long filter can also be separated into two shorter filters. Accordingly, the 4-tap filter 400 can be considered as two, 2-tap FIR filters or four, 1-tap FIR filters cascaded together. Similarly, multiple 4-tap FIR filters 400 can also be cascaded together to form longer filters.

Figure 5:
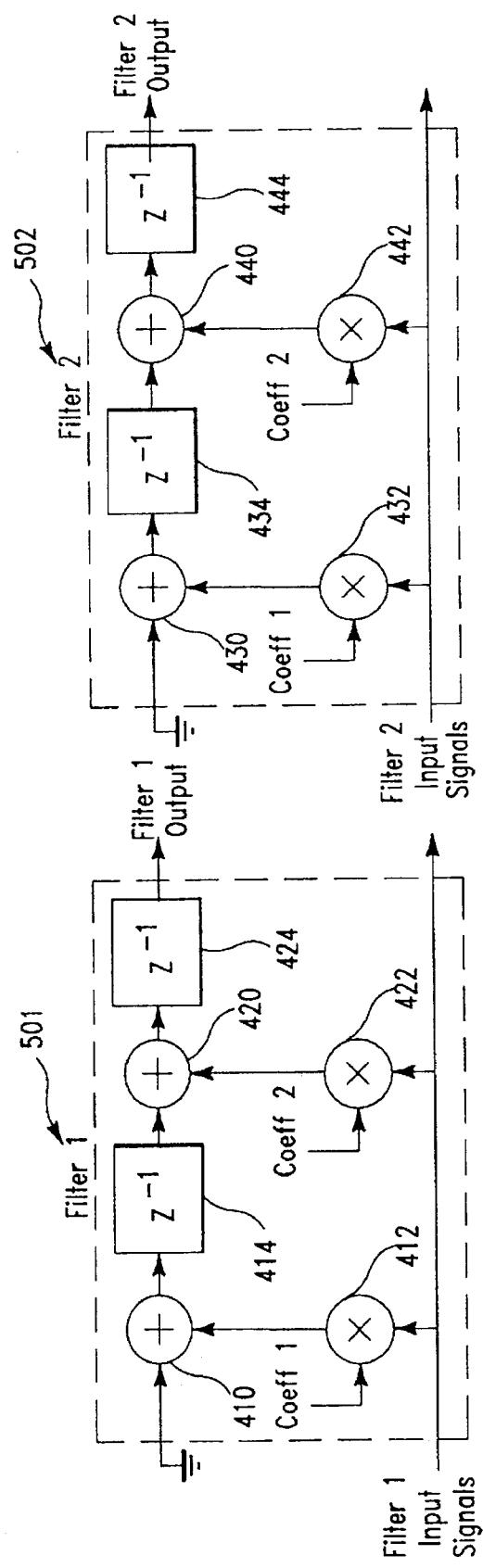
FIG. 5 is a diagram illustrating how the 4 tap FIR filter of FIG. 4 can be divided into two 2-tap FIR filters.

FIG. 5, illustrates how the 4-tap FIR filter 400 can easily be separated in two 2-tap FIR filters 501, 502 which comprise taps 1, 2 (401, 402) and 3, 4 (403, 404) of the 4-tap filter 400, respectively.

The transposed form implementation of a multiple tap FIR filter is used, in accordance with one embodiment of the present invention, to construct the VSB/QAM equalizer 100. However, other forms of FIR filters may also be used for the FIR filter portion of the equalizer 100 such that the present invention is not limited solely to the transposed FIR filter embodiment.

In view of the cascadable nature of various types of FIR filters, it is possible to implement an equalizer using multiple filter sections or taps that can be cascaded together to form longer filters or separated into shorter filters. For example, if a QAM equalizer requires a 256-tap filter, then the filter can be implemented with four 64-tap filters. Each of the four 64-tap filters can be implemented in either the direct form or the transposed form.

In accordance with the present invention, in QAM mode, 4 64-tap filter sections are cascaded together to form the 256-tap FIR filter, represented by the combination 205 of the first and second equalizer circuits 102, 104 required to implement the QAM portion of the VSB/QAM equalizer 100. In VSB mode, the same 4 64-tap filter sections are combined not into a single 256-tap FIR filter, but rather into two separate 64-tap equalizer circuits 102, 104. The 128-tap filter section corresponding to the first equalizer circuit 102 serves as the feed forward section of the equalizer 100 during VSB mode. The second 128-tap filter section 104, on the other hand, corresponds to the second equalizer circuit 104 which serves as the feedback section of the equalizer 100 during VSB mode. As will be discussed in detail below, the VSB/QAM equalizer 100 will then have a 128-tap complex (2×64=128) feed forward section 102 and a 256-tap real (2×64×2=256) decision feedback section 104.

In the straight forward implementation, multiplying two complex numbers requires four real multiplications and two real additions:

(i a+bj)×(c+dj)=(ac−bd)+(ad+bc)j, where $$j = \sqrt{-1}$$

and where a, b, c, and d are real numbers.

Figure 6A:
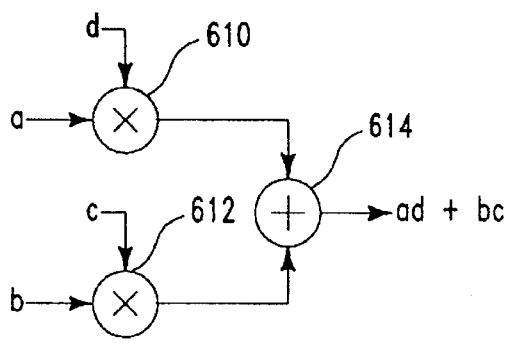
FIGS. 6A and 6B, in combination, illustrate the implementation of a complex multiplier.
Figure 6B:
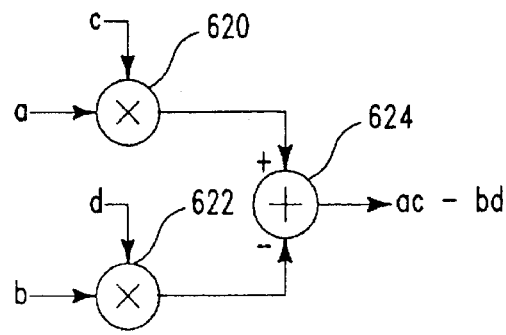

In accordance with the present invention, a complex multiplier can be implemented by using the circuits illustrated in FIGS. 6A and 6B to calculate the real and imaginary parts of the product resulting from a complex multiplication, respectively.

As illustrated, the circuit in FIG. 6A comprises first and second multipliers 610 and 612 and a summer 614. The first multiplier receives as its inputs the coefficient values a and d and generates as its output the value (ad). The second multiplier 612 receives as its inputs the coefficients c and b and generates as its output the value (cb). The summer 614 is responsible for summing the outputs (ad) and (cd) of the first and second multipliers 610, 612 to generate the value (ad+bc) representing the real portion of the result of a complex multiplication operation of (a+bj)×(c+dj).

As illustrated, the circuit in FIG. 6B comprises first and second multipliers 620 and 622 and a summer 624. The first multiplier receives as its inputs the coefficient values a and c and generates as its output the value (ac). The second multiplier 622 receives as its inputs the coefficients b and d and generates as its output the value (bd). The summer 614, which has a summing input coupled to the output of the first multiplier 620 and a subtracting input coupled to the output of the second multiplier 622 is responsible for subtracting the output (bd) from (ac) to generate the value (bd−ac) representing the imaginary portion of the result of a complex multiplication operation of (a+bj)×(c+dj).

One of the biggest disadvantages of an FIR filter is the amount of hardware required for implementation due to the number of arithmetic operators required. In a FIR filter, such as the 4-tap real FIR filter 400, there is a multiplier and an adder for each tap.

The hardware for implementing a long FIR filter becomes even more costly if the FIR filter has a complex input, coefficients and output. For high speed applications, parallel hardware and pipe lining are often needed to achieve a desired operating speed. However, parallel hardware and pipelined designs further increase the amount of hardware required to implement a filter. To reduce the cost of hardware, several techniques of the present invention can be used to reduce the amount of hardware used to perform the arithmetic calculations for an FIR filter while achieving a desired operating speed.

One way of doubling the speed of arithmetic operations, according to the present invention, will now be discussed. With each new input sample, each tap of a FIR filter, e.g., the filter 400, will multiply the input sample by the filter tap coefficient and add a partial sum from the previous tap to form a partial sum tap output, e.g., the output of the multiplier 412.

In general, the clock speed for the hardware in an FIR filter will be the same as the input sampling rate. The arithmetic operators will then operate at the input rate for each tap, i.e., one multiplication and one addition per tap per clock cycle.

For a 2-tap FIR filter, e.g., filter 501, the difference equation between the input and the output samples can be expressed as:

$$y[n] = \sum_{i=0}^{1} x[n-i] \times h[i] = x[n] \times h[0] + x[n-1] \times h[1]$$

where x[n]=filter input samples;
where y[n]=filter output samples;
where h[i]=filter coefficient for tap i.

If a clock that is at twice the input signal rate is available, then it is possible to operate multipliers and adders at twice the input signal rate. When the multipliers and adders operate at that rate, the computation needed for each filter tap can be completed in half of the input sample interval so two taps can share 1 set of multipliers and adder(s) for the arithmetic operations. This will reduce the hardware for the arithmetic operators by 50%. Faster multipliers or adders usually require more hardware per multiplier or adder. In addition, the operands for the multipliers and adders have to be multiplexed so that more than one filter tap can time share the same arithmetic operators. While the storage requirements for the partial sum generated by the multiplying operation remains the same when using multiplexed arithmetic operators, storage elements, not needed in the case on non-multiplexed arithmetic operators, are required to maintain identical pipeline delays.

Accordingly, the total hardware savings that can be achieved by multiplexing the arithmetic operators and operating the arithmetic operators a twice the sampling rate will be less than 50%. However, the savings are still expected to be significant, especially if the multipliers are complex since each complex multiplier consists of four real multipliers, e.g., the four multipliers of FIGS. 6A and 6B 610, 612, 620, 622, and two real adders, e.g., the two adders of FIGS. 6A and 6B 614, 624.

Figure 7:
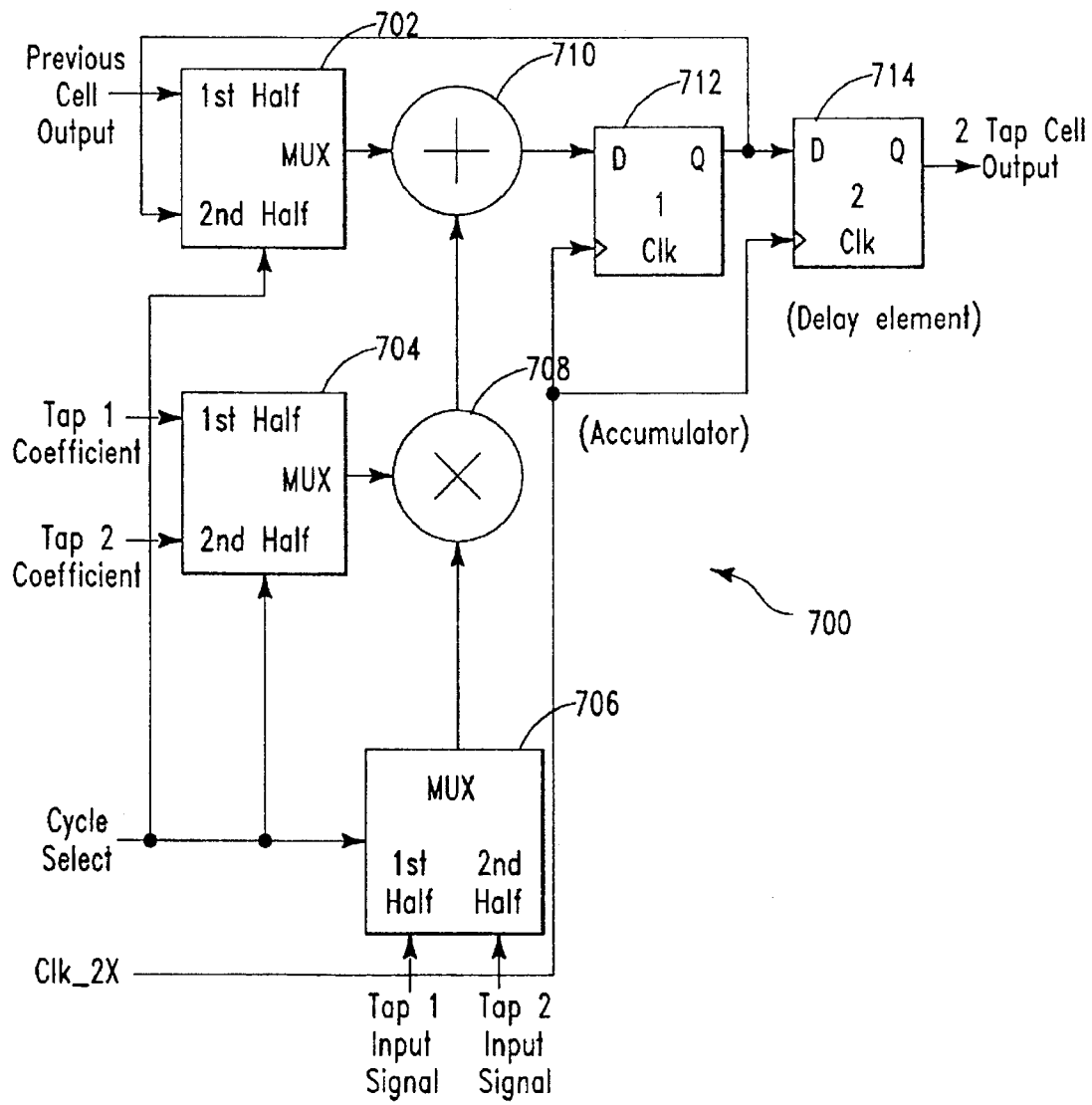
FIG. 7 is a schematic block diagram of a circuit which can be used, in accordance with the present invention to permit the sharing of arithmetic operators between 2 taps of a FIR filter.

Referring now to FIG. 7, there is illustrated a block diagram of a 2-tap FIR filter 700, sharing one set of arithmetic operators, implemented in accordance with the present invention. Note that the 2-tap FIR filter 700 can be used to perform the same function as the previously described 2-tap FIR filters 501, 502. As illustrated, the 2-tap FIR filter 700 comprises first, second and third MUXs 702, 704, 706 each of which have first and second inputs, a single set of arithmetic operators including a multiplier 708 and a summer 710, and first and second storage elements, i.e., an accumulator 712 and a delay element 714.

The first MUX 702 receives the output of the previous cell or tap at a first input and a feedback signal from the output of the accumulator 712 as its second input. The second MUX 704 receives the Tap 1 coefficient at its first input and a Tap 2 coefficient at its second input. The third MUX 706 receives at its first input a Tap 1 input sample and a Tap 2 input sample at its second input.

The first, second, and third multiplexers 702, 704, and 706 each receive, and are controlled by, a cycle select signal. During the first half of a cycle which corresponds to the length of a sampling rate clock cycle, the cycle select signal causes the first, second, and third MUXes 702, 704, 706 to output the signal or coefficient received at the MUXes' first input while during the second half of the cycle, the same MUXes 702, 704, 706 are controlled to output the signals or coefficients received at their second input.

The output of the second and third MUXes 706, 704 are coupled to the first and second inputs of the multiplier 708. The multiplier 708, in turn, has an output coupled to an input of the summer 710. A second input of the summer 710 is coupled to the output of the first MUX 702.

The output of the summer 710 is coupled to the input of the accumulator 712 implemented using, e.g., a D flip-flop as memory elements. The output of the accumulator 712 is coupled to the input of the delay element 714 which can also be implemented using, e.g., D flip-flops. A clock signal input of the accumulator 712 and delay element 714 received a CLK_2X signal which is a clock signal having a rate that is twice the sampling rate of the signal being filtered. While the accumulator is responsive to each clock cycle of the CLK_2X signal to store and output the received input signal, the delay element 714 requires 2 clock cycles before storing and outputing the value applied to its input.

The output of the delay element 714 represents the output of the 2-tap FIR filter 700.

In the 2-tap FIR filter illustrated in FIG. 7, the two filter taps share the same arithmetic operators while performing the operations at twice the input rate. The delay elements ($Z^{-1}$) in the signal flow graphs in FIGS. 4 and 5 have been replaced in FIG. 7 with the memory elements, the accumulator 712 and delay element 714. As discussed above, CLK_2X is a clock signal that is running at twice the input sampling rate. The Cycle Select signal indicates which half of the input interval the circuit should be operating in and, as discussed above, is used to control the first, second, and third MUXes 702, 704, and 706 and other flip-flops as may be required to direct different signals to the operands of the arithmetic operators 708, 710.

In the first half of each input sample interval, the arithmetic operators 708, 710 compute the product of the Tap 1 input sample, x[n−1] in the difference equation, and the coefficient for Tap 1, h[1] in the difference equation, and sum the previous cell, i.e., tap, output to the product. The result of the calculation is stored in the accumulator 712. During the second half of the input sample interval, the multiplier 708 is used to compute the product of the input signal, i.e., the Tap 2 input sample, x[n] in the difference equation, and the Tap 2 coefficient, i.e., weight, for tap 2, h[0] in the difference equation, while the adder 710 is used to sum the value stored in the accumulator 712 to the product thus produced by the multiplier 708. The result of the addition (x[n]h[0]+x[n−1]h[1]) is then stored in the accumulator 712 and delay element 714 before being output by the 2-tap FIR filter 700.

The delay element 714 provides a second one symbol delay of the 2-tap filter output in order to maintain the same number of delays between the input and output as in the conventional 2-tap FIR filter 501 in transposed form. Note that the D flip-flops used to implement the accumulator 712 and delay element 714, in the illustrated embodiment, are really flip-flops with an enable signal to allow the flip-flops to store the input only when selected. The enable signal, which is asserted slightly before the start of each half cycle is omitted from FIG. 7.

It is worth noting that the arithmetic operator sharing operation described above with regard to FIG. 7, can be applied again if a clock at four times the input rate is available. This will permit four taps to share one set of multipliers and adders.

As the number of taps sharing one set of multipliers and adders increases, the multiplexing of arithmetic operands becomes more complex. In addition, more storage elements will also be required to store input samples. Furthermore, hardware savings become less pronounced when the multiplexers are considered. In theory, it is possible to have all of the taps of an FIR filter share one set of multipliers and adders. This results in a vector processor or general-processor-like implementation for large filters. Unfortunately, with such an embodiment the arithmetic operators will have to operate at extremely high speeds or conversely, the input sampling rate must be relatively low for long filters.

In addition to sharing arithmetic operators as discussed above, another opportunity to reduce hardware requirements for FIR equalizer filter circuits exists when a decimating FIR filter is being used. When the filter output rate is half of the input sampling rate, only half of the computations performed are necessary, so the arithmetic operators are necessary only half of the time. By sharing the arithmetic operators between two taps, e.g., in the manner discussed above, the amount of hardware required for the arithmetic operators can then be reduced by, e.g., 50%.

However, unlike the previously described embodiment, in a decimating filter embodiment, the arithmetic operators will be used to compute the result for two filter taps in two input sample intervals with one tap result being calculated per input sample interval.

Like the previously described arithmetic operator or resource sharing technique, this arithmetic operator sharing technique can be applied again if the output samples are decimated by a factor of, e.g., four. This will result in four taps sharing one set of multipliers and adders. As the number of taps sharing one set of multipliers and adders increases, the multiplexing of operands becomes more complex. The percentage of overall savings in hardware will therefore decrease as the number of taps sharing the same arithmetic operators is increased.

While, in theory, it is possible to have all of the taps of a FIR filter share one set of multipliers and adders in accordance with the present invention, this results in a vector processor or general-processor-like implementation. Furthermore, when a high degree of decimation is performed to reduce hardware requirements, the high degree of decimation of the input signal results in a filter output that is much less useful than when no or a low degree of decimation is performed.

Implementation of the FIR filter used by the VSB/QAM equalizer 100 using the above described hardware reduction methods will now be described.

Since, in QAM mode, the VSB/QAM equalizer 100 acts as a fractionally spaced equalizer with the input being at twice the symbol rate and the output being at the symbol rate, the equalizer filtering operation performed in QAM mode can be performed by a decimating FIR filter with a downsampling factor of two. By applying the two above described resource sharing techniques, four taps of an FIR filter can share one set of arithmetic operators. In such an embodiment, the arithmetic operators will operate at twice the input sample rate, e.g., at four times the input symbol rate and the FIR filter output is only calculated once for each symbol time. For a 64 tap FIR filter implemented in accordance with such an approach, only 16 sets of arithmetic operators are required. To accomplish this, the input samples to the 64 tap FIR filter of the present invention and the filter coefficients are multiplexed to the inputs of the arithmetic operators. Each of the complex multipliers required to implement the complex FIR filter of the present invention consists of four real multipliers and two adders.

Figure 8:
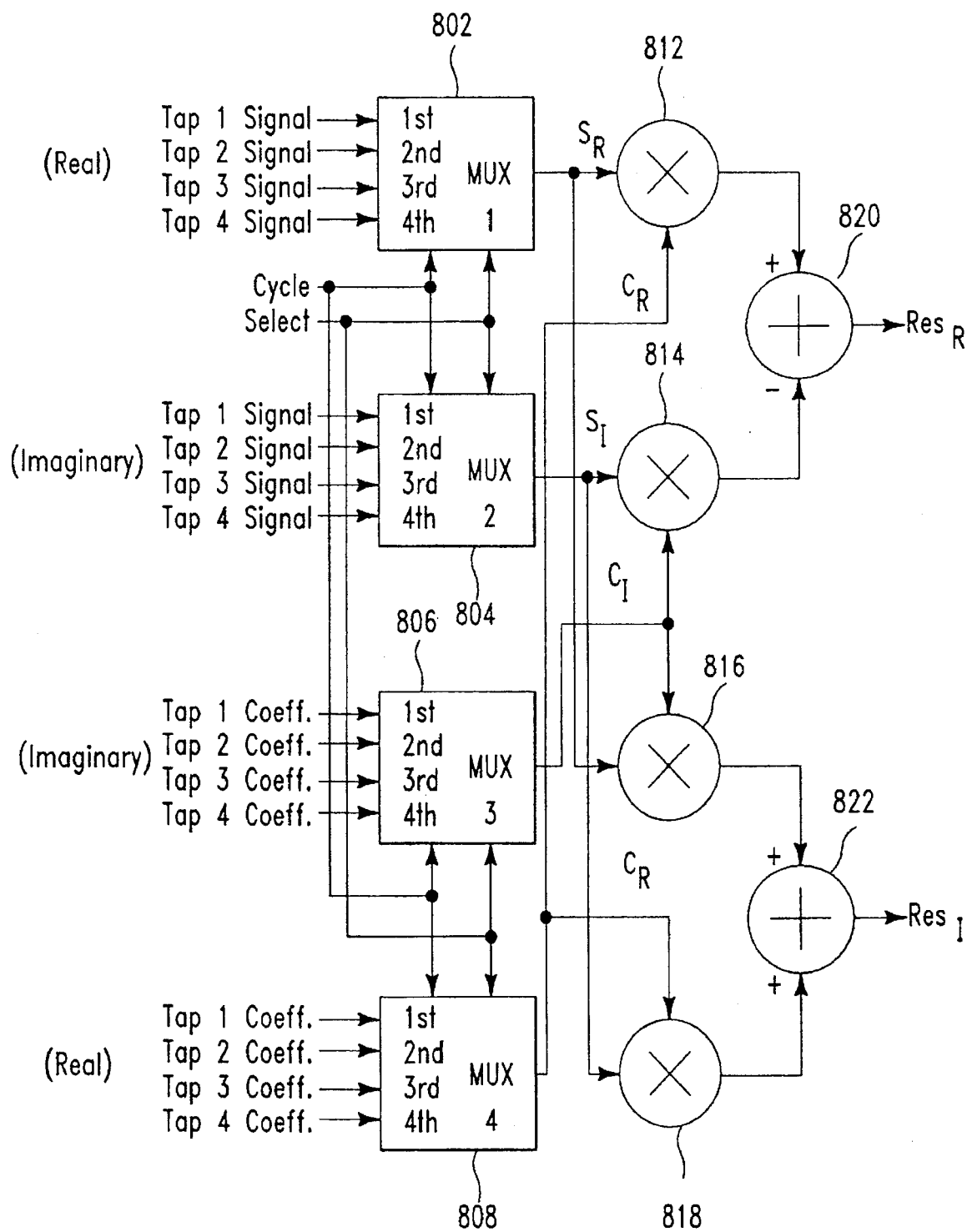
FIG. 8 is a schematic block diagram of a circuit which permits 4 taps of an FIR filter to share one set of arithmetic operators.

Referring now to FIG. 8, there is illustrated a 4 tap complex multiplication circuit for performing a complex multiplication operation for each of four different taps of a complex FIR filter in accordance with one embodiment of the present invention. As illustrated, the 4 tap complex multiplication circuit 800 comprises first through fourth MUXes 802, 804, 806, 808, first through fourth multipliers 812, 814, 816, 818 and first and second summers 820, 822.

The first MUX 802 receives as its input the first through fourth real tap signal inputs to the 4-Tap complex multiplication circuit 800 while the second MUX 804 receives the first through fourth imaginary tap signal inputs to the circuit 800. Similarly, the first through fourth imaginary coefficients are supplied to the third MUX 806 while the first through fourth real filter coefficients are supplied as input signals to the fourth MUX 808. The first through fourth MUXes 802, 804, 806, 808 also receive as input signals the cycle signal and the select control signal.

The first and third multipliers 812, 816 receive as a first input the real tap signal output by the first MUX 802. The first multiplier 812 receives as a second input the real filter coefficient output by the fourth MUX 808. The first multiplier 812 multiplies the real tap signal output by the first MUX 802 and the real filter coefficient output by the fourth MUX 808 to generate a value which is supplied to a summing input of the first summer 820.

The second multiplier 814, which is coupled to the output of the second and third MUXes 804, 806, multiplies the imaginary tap signal value output by the second MUX 804 with the imaginary tap coefficient output by the third MUX 806. The value generated by the second multiplier 814 is supplied to a subtracting input of the first summer 820 which generates as its output the real portion of tap signal output of the circuit 800.

The third multiplier receives as its inputs the imaginary coefficient output by the third MUX 806 and the real tap signal output by the first MUX 802. The fourth multiplier 818 receives as its inputs the real tap coefficient output by the fourth MUX 808 and the imaginary tap signal output by the second MUX 804. The values generated by the third and fourth multipliers 816, 816 are supplied to Summing inputs of the second summer 822 which generates as its output the imaginary portion of the tap signal output of the 4-Tap complex multiplication circuit 800.

In the illustration of FIG. 8, $S_R$ and $S_I$ represent the input operands to the first through fourth multipliers 812, 814, 816, 818. They are output by the first and second MUXes 802, 804 respectively and correspond to the ones of the four shared taps' input signals being processed at any give time. Similarly, $C_R$ and $C_I$ are the input operands to the multipliers. They are output by the third and fourth MUXes 806, 808 which are the multiplexers for the fourth shared taps' coefficients. $RES_R$ and $RES_I$ are the real part and the imaginary part, respectively, of the complex multiplication results between the input sample and the filter coefficient.

In accordance with the present invention, to implement a decimating FIR filter that shares the same arithmetic operators for multiple taps by operating at twice the input rate, in one embodiment, the arithmetic operators of FIG. 8 are operated at twice the input rate. Because the arithmetic operators operate at twice the input rate and the output rate is half of the input rate, each output interval can be divided into four phases. The control signal "Cycle select" controls which of the four phases the 4-tap complex multiplication circuit 800 is operating in at any given time. Thus, the cycle select signal controls which of the four taps' signal and coefficient will be used as $S_R$, $S_I$, $C_R$, $C_I$ for calculation. For purposes of simplicity, the accumulator and storage elements used to store intermediate results, e.g., for feedback purposes, are not shown in the embodiment of FIG. 8 as they are in FIG. 7.

Methods for using the same arithmetic operators, used during QAM mode operation to implement QAM equalizer circuitry, to implement VSB equalizer circuitry during VSB mode operation will now be discussed first in respect to the feed forward section 102 of the VSB/QAM equalizer 100 during VSB mode operation and then with respect to the decision feedback section 104.

As discussed above, with regard to FIG. 1, when operating in VSB mode, the first equalizer circuit 102 operates as a feed forward FIR filter. During VSB mode, the feed forward part of the VSB equalizer is not a decimating FIR filter. The filter 102 is still a complex filter, but, in accordance with the present invention, only the real part of the filter output is used, i.e., the part (ac−bd) which results from the complex multiplication operation previously discussed. Thus, the imaginary part, (ad+bc) of the output need not be calculated. In addition, the symbol rate for the equalizer 100 when operating in VSB mode, is also approximately twice the symbol rate for the QAM equalizer. The arithmetic operators that are designed to operate at four times the QAM symbol rate are used at twice the VSB symbol rate for VSB mode operation. Thus, during VSB mode, the first equalizer circuit 102, which is not a fractionally spaced equalizer circuit during VSB mode operation, operates at twice the input sampling rate for VSB.

Since, during VSB mode operation, the arithmetic operators used to implement the first and second equalizer circuits 102, 104 can still operate at twice the input sampling rate, the technique described previously which permits two taps of an FIR filter to share the same arithmetic operators can be used.

The output samples of the feed forward section of the equalizer 100 during VSB mode are not decimated. Accordingly, the technique discussed above for sharing arithmetic operators between taps to implement a decimating filter can not be used during VSB mode operation. However, the arithmetic operators used to compute the imaginary part of a complex multiplication, used during QAM mode operation, can be used to compute the real part of another filter tap during VSB mode. This will still allow four filter taps to share the same set of arithmetic operators in one cell and utilize them fully even when every filter output sample is used since this set of arithmetic operators is still operating at twice the VSB symbol rate, i.e., at approximately four times the expected HDTV QAM symbol rate.

Figure 9:
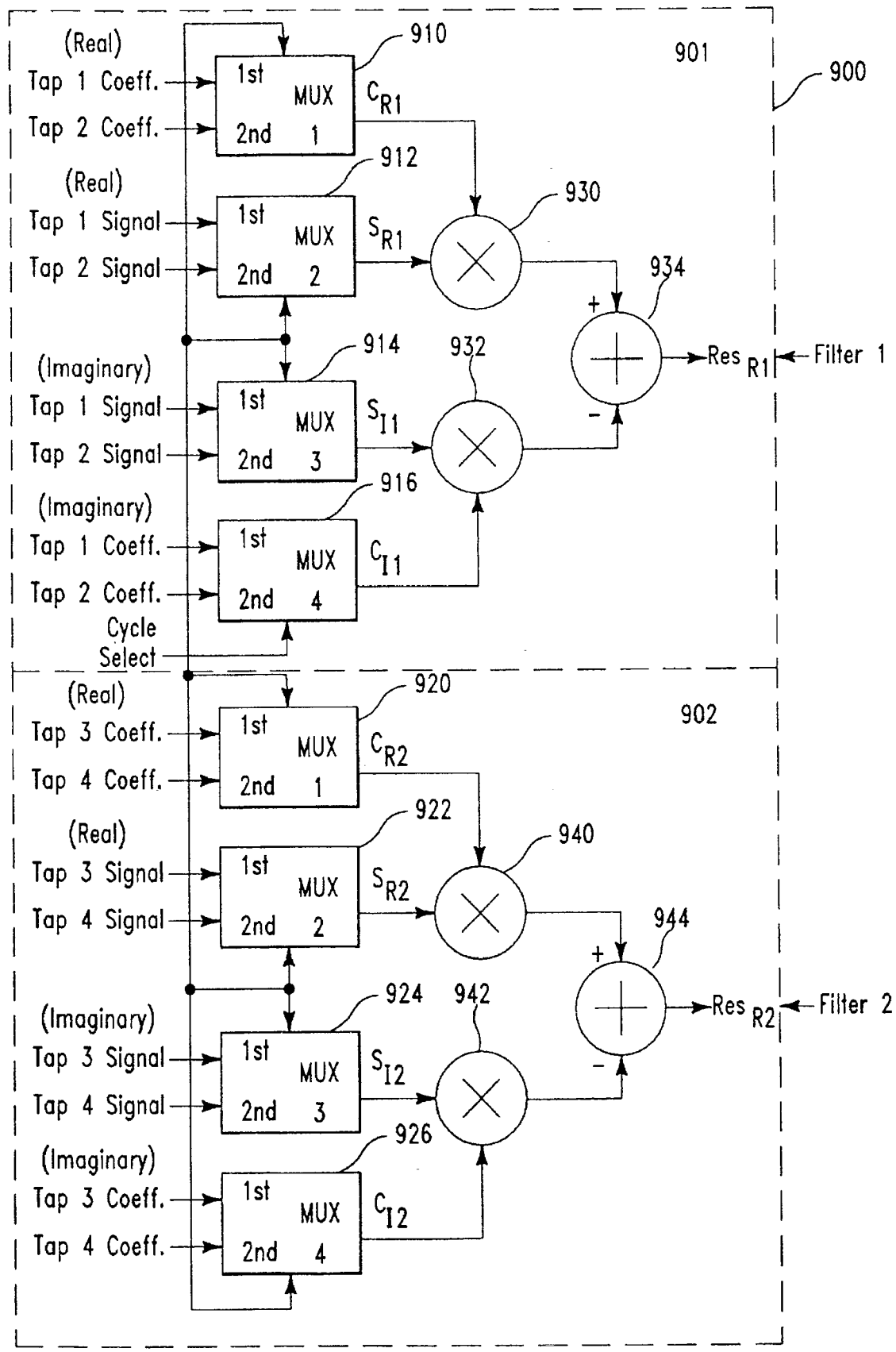
FIG. 9 is a schematic block diagram illustrating the implementation of VSB feed forward equalizer filter circuitry in accordance with one embodiment of the present invention.

Since the set of operators in a cell, i.e., the circuit unit which corresponds to, e.g., four filter taps, calculates two different filter results, the operands can be multiplexed such that they perform the arithmetic operations for two independent real filters 901, 902 as shown in FIG. 9.

The independent 4-tap real FIR filter 900 which comprises the two real filters 901, 902, can be cascaded together for a longer filter. The input samples and the filter coefficients for each of the four taps need to be multiplexed to the input of the arithmetic operators illustrated in FIG. 9. Using the above described arithmetic operator sharing technique and use of the arithmetic operators used in QAM mode to calculate the complex portion of a complex multiplication operation to calculate the real result required for VSB mode operation, it is possible to use 16 sets of arithmetic operators to compute the output samples of a 64-tap real FIR filter.

Referring now to FIG. 9, there is illustrated a schematic diagram showing the sharing of arithmetic operators for a 4-tap FIR filter 900 comprising two 2-tap real FIR filters 901, 902. The 4-tap FIR filter 900 may be thought of as a cell which can be combined with other cells to make a larger filter.

As illustrated, the first and second 2-tap real FIR filters 901, 902 each comprise first through fourth MUXes 910, 912, 914, 916 and 920, 922, 924, 926, first and second multipliers 930, 932 and 940, 942 and a summer 934 and 944, respectively.

Because of the similarity between the circuitry of the first and second filters 901, 902 of the 4-tap FIR filter 900, only the operation of the first filter 901 will be discussed in detail.

The first MUX 910 of the first filter 901 receives as its inputs the Tap 1 and Tap 2 real coefficients and produces as its output the signal $C_{R1}$. The second MUX 912 receives as its inputs the real Tap 1 and Tap 2 signals and generates as its output the signal $S_{R1}$. The third MUX 914 receives as its input the imaginary portion of the Tap 1 and Tap 2 signals and generates as its output the signal $S_{I1}$. The fourth MUX 916 receives as its input the imaginary portion of the Tap 1 and Tap 2 coefficients and generates as its output the signal $C_{I1}$.

The first multiplier 930 of the filter 900 has its inputs coupled to the outputs of the first and second MUXes 910, 912, respectively, and an output coupled to a summing input of the summer 934. The second multiplier 932 has its inputs coupled to the outputs of the third and fourth MUXes 940, 942, respectively, and an output coupled to a subtracting input of the summer 934. The summer 934 generates the signal $RES_{R1}$.

The second filter 902 operates in a similar manner to generate the signal $RES_{R2}$ from the Tap 3 and Tap 4 signal inputs and coefficients.

In FIG. 9, $S_{R1}$, $S_{I1}$, $S_{R2}$, and $S_{I2}$, are the real and imaginary parts of input operands supplied to the multipliers 930, 932, 940, 942 of filters 1 and 2 901, 902 of FIG. 9. They are the output of the MUXes for the four shared taps' input signals 912, 914, 922, 924. Similarly, $C_{R1}$, $C_{I1}$, $C_{R2}$, $C_{I2}$ are the input operands to the multipliers 930, 932, 940, 942 of filters 1 and 2. They are the output of the MUXes 910, 916, 920, 926 for the four shared taps' coefficients. $RES_{R1}$ and $RES_{R2}$ are the real parts of the complex multiplication results between the input sample and the filter coefficients for Filter 1 901 and Filter 2 902, respectively.

Since, as discussed above, operators operate at twice the input rate and the output rate is the same as the input rate, each output interval can, and is, divided into two phases. The Cycle select signal which is supplied to a control input of each of the MUXes 910, 912, 914, 916, 920, 922, 924, 926. The Cycle select signal determines the phase and therefore controls which of the four taps' signal and coefficient is output as $S_{R1}$, $S_{I1}$, $S_{R2}$, $S_{I2}$, $C_{R1}$, $C_{I1}$, $C_{R2}$, and $C_{I2}$ for calculation.

Implementation of the second equalizer circuit 104 which serves as the decision feedback section of the VSB/QAM equalizer 100, during VSB mode operation, will now be discussed. The decision feedback part 104 of the VSB/QAM equalizer circuit 100 is a real, non-decimating FIR filter. Since the input samples and the filter coefficients are real, only one multiplier is needed to compute the result of each tap. By using four multipliers at twice the input sampling rate, the results of eight taps can be calculated for each symbol interval. The two adders in a set of arithmetic operators used in QAM mode to sum the partial products together into the real and the imaginary part of a complex multiplication can be used to sum the four tap results into two results at each half symbol interval. This allows the filter to be implemented using two independent filters. The two independent filters, e.g., 4-tap real FIR filters, can also be cascaded together to form a longer filter, e.g., an 8-tap real FIR filter such as the one illustrated in FIG. 10. Using this approach, it is possible to implement two real 64-tap FIR filters or one real 128 tap FIR filter using only 16 sets of arithmetic operators.

Figure 10:
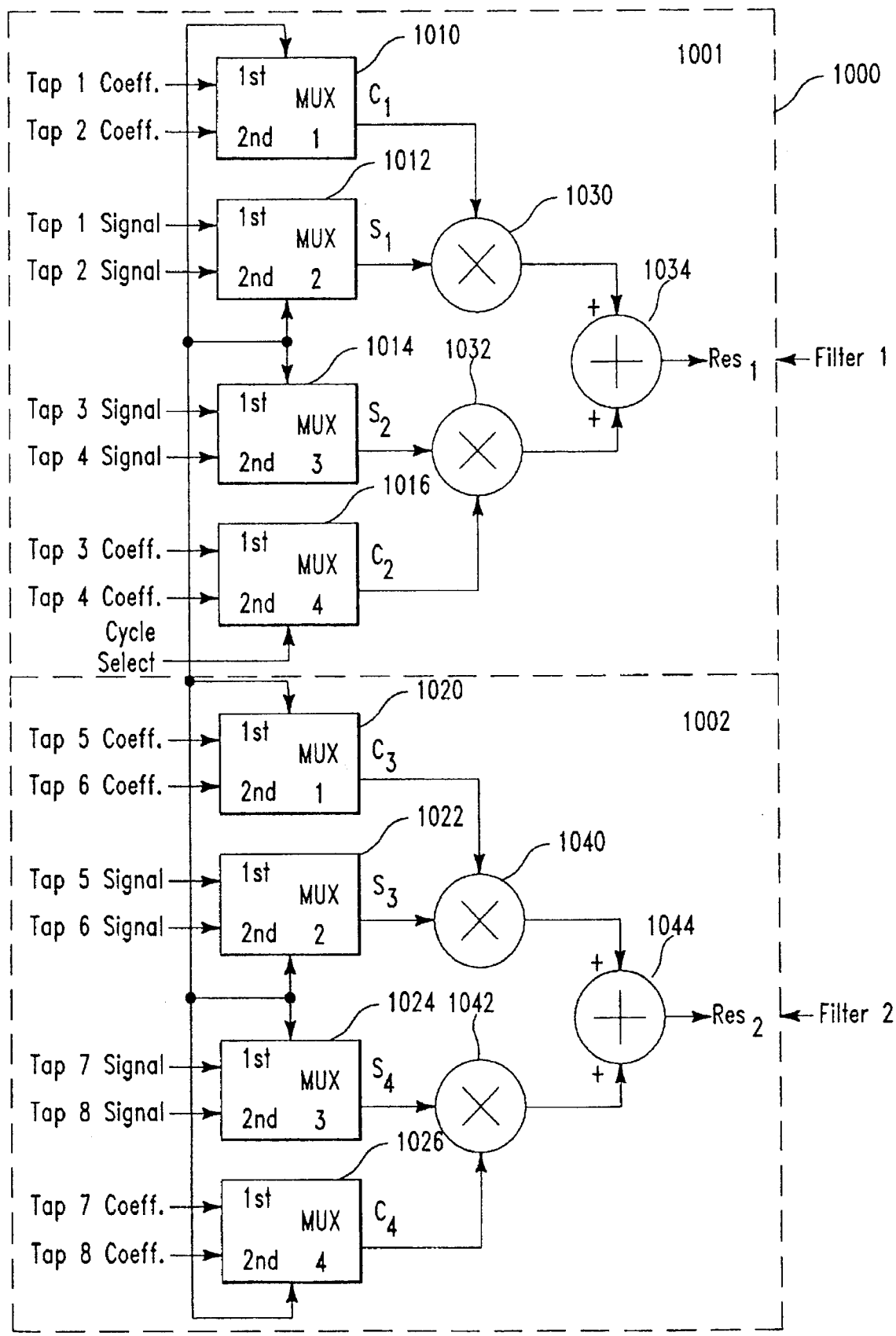
FIG. 10 is a schematic block diagram illustrating the implementation of VSB decision feedback equalizer filter circuitry in accordance with one embodiment of the present invention.

Referring now to FIG. 10, there is illustrated a schematic diagram showing the sharing of arithmetic operators for an 8-tap real FIR filter 1000 comprising two 4-tap real FIR filters 1001, 1002.

As illustrated, the first and second 4-tap real FIR filters 1001, 1002 comprise first through fourth MUXes 1010, 1012, 1014, 1016 and 1020, 1022, 1024, 1026, first and second multipliers 1030, 1032 and 1040, 1042 and a summer 1034 and 1044, respectively.

Because of the similarity between the circuitry of the first and second filters 1001, 1002 of the 8-tap FIR filter 1000, only the operation of the first filter 1001 will be discussed in detail.

The first MUX 1010 of the first filter 1001 receives as its inputs the Tap 1 and Tap 2 coefficients and produces as its output the signal $C_1$. The second MUX 1012 receives as its inputs the Tap 1 and Tap 2 signals and generates as its output the signal $S_1$. The third MUX 1014 receives as its input the Tap 3 and Tap 4 signals and generates as its output the signal $S_2$. The fourth MUX 1016 receives as its input the Tap 3 and Tap 4 coefficients and generates as its output the signal $C_2$.

The first multiplier 1030 of the filter 1000 has its inputs coupled to the outputs of the first and second MUXes 1010, 1012, respectively, and an output coupled to a first summing input of the summer 1034. The second multiplier 1032 has its inputs coupled to the outputs of the third and fourth MUXes 1040, 1042, respectively, and an output coupled to a second summing input of the summer 1034. The summer 1034 generates the signal $RES_1$.

The second filter 1002 operates in a similar manner to generate the signal $RES_2$ from the Tap 5, 6, 7 and 8 signal inputs and coefficients.

In FIG. 10, $S_1$, $S_2$, $S_3$ and $S_4$, are the input operands to the multipliers for Filters 1 and 2 1001, 1002 of FIG. 9. They are the output of the multiplexers 1012, 1014, 1022, 1024 for the eight shared taps' input signals. Similarly $C_1$, $C_2$, $C_3$, and $C_4$ are the input operands to the multipliers. They are the output of the MUXes 1010, 1016, 1020, 1026 for the eight shared taps' coefficients. $Res_1$ and $Res_2$ are the multiplication results between the input sample and the filter coefficient of and the filter coefficient of two filter taps for filter 1 and filter 2 1001, 1002, respectively. Since the arithmetic operators operate at twice the input rate and the output rate is the same as the input rate, each output interval can, in accordance with the present invention, be divided into two phases. The Cycle select signal which is supplied as a control signal to each of the MUXes 1010, 1012, 1014, 1016, 1020, 1022, 1024, 1026 controls the phase and thus output of the MUXes. Thus, the Cycle select signal determines which of the eight taps' signal and coefficients will be output, as the signals $S_1$, $S_2$, $S_3$ and $S_4$, and the coefficients $C_1$, $C_2$, $C_3$, and $C_4$, and processed at any given time.

The above discussion has focused on the structure of the VSB/QAM equalizer 100 when operating in either VSB or QAM modes of operation. .The circuitry required to switch between these two modes of operation and to reconfigure the VSB/QAM equalizer 100 to operate in either VSB or QAM mode will now be discussed.

By examining the arithmetic operator utilization in FIGS. 8, 9, and 10 for the QAM, VSB and VSB decision feedback equalizer circuits, one can see that the structures are very similar among the three different configurations. Furthermore, as discussed above, the symbol rate for QAM in HDTV signals is expected to be approximately half the symbol rate for VSB HDTV signals allowing the arithmetic operators to be designed to operate at four time the symbol rate for QAM. That is, at approximately twice the symbol rate for VSB. By adding multiplexers to the input of the arithmetic operators, the arithmetic operators of the VSB/QAM equalizer 100 can be made to be identical and used for both types of modulation schemes and/or for different sections of the equalizer 100 when operating in VSB mode.

Figure 11:
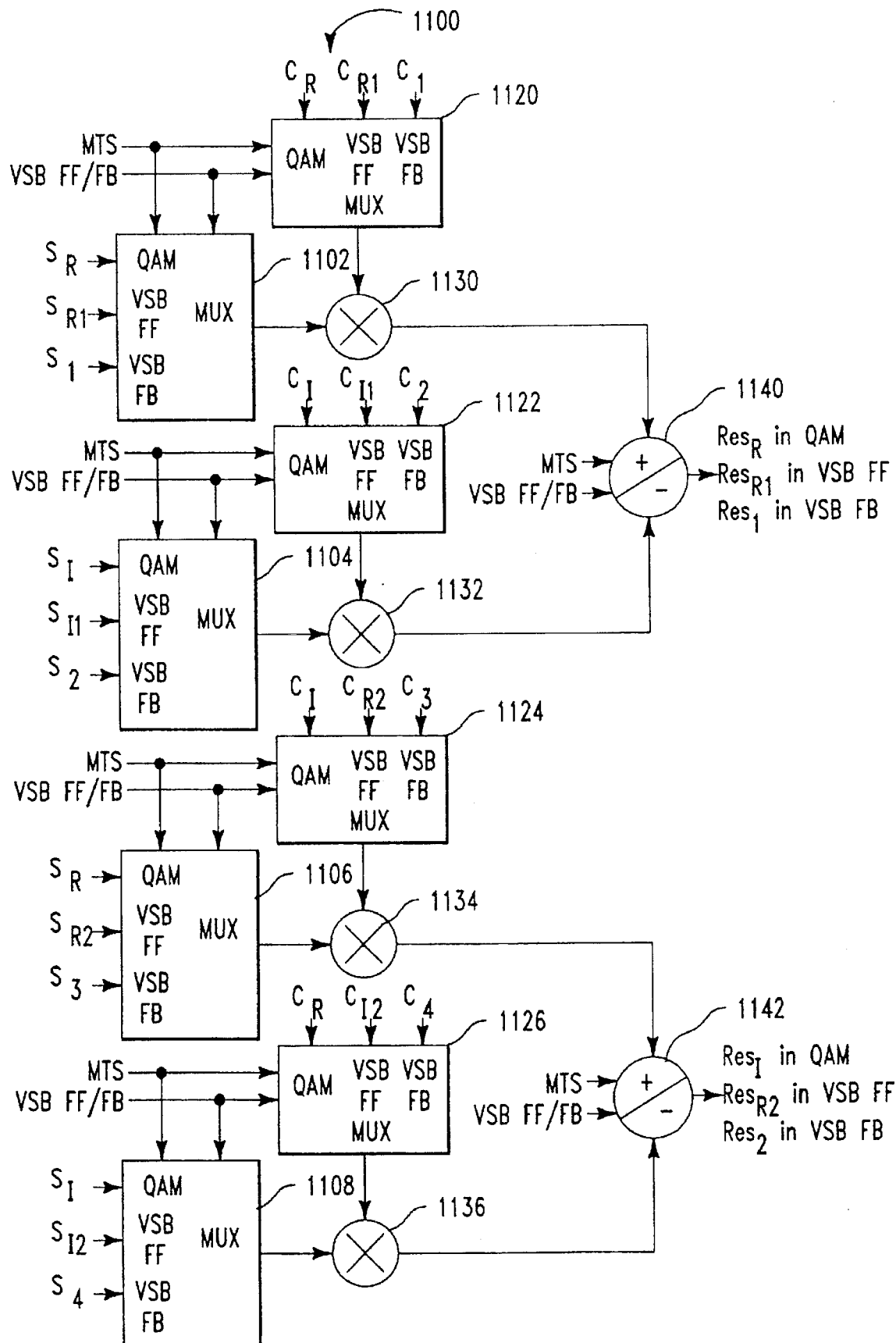
FIG. 11 is a schematic block diagram illustrating the implementation a circuit for providing arithmetic operator sharing among QAM and VSB modes of equalizer circuit operation.

FIG. 11 illustrates a control circuit 1100 for controlling arithmetic operator utilization for the combined VSB/QAM equalizer 100. The control circuit 1100 comprises a first through fourth set of multipliers 1130, 1132, 1134, 1136. A first input of each one of the first through multipliers 1130, 1132, 1134, 1136 is coupled to a respective output of one of a first series of first through fourth MUXes 1102, 1104, 1106, 1108. A second input of each one of the first through multipliers 1130, 1132, 1134, 1136 is coupled to a respective output of one of a second series of first through fourth MUXes 1120, 1122, 1124, 1126.

The outputs of the first and second multipliers are coupled to a first dual function adder/subtractor or programmable adder 1140. Similarly, the outputs of the third and fourth multipliers 1134, 1136 are coupled to the inputs of a second dual function adder/subtractor 1142.

The two series of first through fourth MUXes 1102, 1104, 1106, 1108 1120, 1122, 1124, 1126 and the first and second dual function adders/subtractors 1140, 1142 receive as control signal inputs the modulation type selection ("MTS") signal which is used to control whether the control circuit 1100 operates in VSB or QAM mode and a VSB FF/FB control signal which indicates whether the filter circuit being controlled is to operate as the feed forward or feedback portion of the equalizer 100 when operating in VSB mode.

Note that the input of the MUXes in the control circuit of FIG. 11 are the output of the MUXes for the filter tap signals and coefficients in FIGS. 8, 9 and 10 with identical signal names being used to represent the same signals throughout FIGS. 8-11. For purposes of simplicity of illustration, the tap signal and coefficient MUXes shown in FIGS. 8, 9, and 10 are not illustrated again in FIG. 11.

As discussed above, the MTS signal is used to indicate whether the incoming signal is a QAM or VSB signal and to control the configuration of the equalizer 104, and control circuit 1100 accordingly. VSB FF/FB is a control signal which determines whether a particular cell, i.e., filter, is configured as the feed forward section 102 or the decision feedback section 104 of the VSB/QAM equalizer 100 when operating in VSB mode. Instead of single function adders or subtractors, as shown in FIGS. 8, 9, and 10, the control circuit 1100 of FIG. 11, uses dual functioning adders/ subtractors 1140, 1142. The function of these elements is controlled as a function of the MTS and VSB FF/FB signals.

When the MTS signal indicates that the input is a QAM signal, then the MUXes 1102, 1104, 1106, 1108 1120, 1122, 1124, 1126 will be controlled to select inputs to the arithmetic operators such that FIGS. 8 and 11 implement the same calculations. In such a case, the first adder/subtractor 1140 will be controlled to function as a subtractor and the second adder/subtractor 1142 will be controlled to operate as an adder.

When the MTS signal indicates that the input is a VSB signal, and the VSB FF/FB signal indicates that the cell is to operate as part of the feed forward section 102 of the VSB/QAM equalizer 100, then the MUXes 1102, 1104, 1106, 1108 1120, 1122, 1124, 1126 will be controlled to select inputs to the arithmetic operators such that FIGS. 9 and 11 implement the same calculations. In this mode, both the first and second adders/subtractors 1140, 1142 will be controlled to function as subtractors. Similarly, when the MTS signal indicates that the input is a VSB signal and the VSB FF/FB signal indicates that the cell is operating as the feedback section of the VSB/QAM equalizer 100, then the MUXes 1102, 1104, 1106, 1108 1120, 1122, 1124, 1126 will be controlled to select inputs to the arithmetic operators such that FIGS. 10 and 11 implement the same calculations. Both the first and second adders/subtractors 1140, 1142 will function as adders in such a case.

It is worth noting that the feed forward section of a VSB equalizer can be a real FIR filter, just like the decision feedback section. In such a case, the same configuration and arithmetic operator utilization scheme can be used between the feed forward and the decision feedback sections. The arithmetic operator utilization for a cell will then look like that of FIG. 10, allowing eight taps to share one cell for both the feedforward and decision feedback section of the equalizer. The hardware implementation for such a filter is simpler than that of an equalizer with a complex feed forward section since only two configurations have to be implemented.

While the methods and equalizer filter circuit apparatus of the present invention have been described primarily in the context of a joint VSB/QAM demodulator, it is to be understood that the same methods could be used to implement independent VSB and/or QAM demodulators.

What is claimed is:

1. A method of implementing an N tap finite impulse response filter including a series of filter cells, wherein N is an integer greater than one, comprising the steps of:
   providing a first filter cell including a first set of arithmetic operators and a first pair of multiplexers for controlling a supply of first tap signals and first tap coefficients to the first set of arithmetic operators; and
   operating the first filter cell to calculate tap outputs corresponding to at least a first m taps of the N tap finite impulse response filter and to output the $m^{th}$ tap output where m is an integer greater than 1 and less than N;
   providing a second filter cell including a feedback circuit, a second set of arithmetic operators, and a second pair of multiplexers for controlling a supply of second tap signals and second tap coefficients to the second set of arithmetic operators;
   providing a previous filter cell input control multiplexer having a first input coupled to the output of the first filter cell and a second input coupled to the feedback circuit; and
   operating the second filter cell to calculate tap outputs corresponding to at least an additional two taps of the N tap finite impulse response filter.

2. The method of claim 1, wherein the tap signals include a tap 1 signal and a tap 2 signal and wherein the tap coefficients include a tap 1 coefficient and a tap 2 coefficient and wherein the step of operating the first filter cell to calculate tap outputs includes the steps of:
   operating the first pair of multiplexers to supply the tap 1 coefficient and the tap 1 signal to the first set of arithmetic operators;
   operating the first set of arithmetic operators to generate a tap 1 output signal;
   operating the first multiplexers to supply the tap 2 coefficient and the tap 2 signal to the first set of arithmetic operators; and
   operating the first set of arithmetic operators to generate a tap 2 output signal as a function of the tap 2 coefficient, tap 2 signal, and tap 1 output signal.

3. The method of claim 2, further comprising the steps of:
   storing the tap 1 output signal in an accumulator before generating the tap 2 output signal.

4. The method of claim 3, further comprising the steps of:
   storing the tap 2 output signal in the accumulator; and then
   storing the tap 2 output signal in a delay element.

5. The method of claim 1, wherein the tap signals and the tap coefficients are complex, and wherein the tap outputs include a real tap output portion and an imaginary tap output portion.

6. A method of sharing arithmetic operators in a feed forward equalizer comprising an N-tap finite impulse response filter for filtering a signal having a first sampling rate, where N is an integer greater than 1, the method comprising the steps of:
   providing a first set of multiplexers for receiving real and imaginary portions of a first set of complex tap signals and a second set of multiplexers for receiving real and imaginary portions of a first set of complex tap coefficients;
   operating the first and second sets of multiplexers at a rate at least twice the sampling rate, to selectively output the real and the imaginary portions of the first set of complex tap signals and the real and the imaginary portions of the first set of complex tap coefficients;
   providing a first set of arithmetic operators; and
   operating the first set of arithmetic operators to generate the real portion resulting from a complex multiplication of the real and imaginary portions of the first set of complex tap signals and the real and imaginary portions of the complex tap coefficients output by the first and second sets of multiplexers each time the first and second sets of multiplexers selectively output the real and imaginary portions of the first set of complex tap signals and the real and imaginary portions of the first set of complex tap coefficients.

7. The method of claim 6, further comprising the steps of:
   providing a third set of multiplexers for receiving real and imaginary portions of a second set of complex tap signals and a fourth set of multiplexers for receiving real and imaginary portions of a second set of complex tap coefficients;
   operating the third and fourth sets of multiplexers at a rate at least twice the sampling rate, to selectively output the real and imaginary portions of the second set of complex tap signals and the real and imaginary portions of the second set of complex tap coefficients;
   providing a second set of arithmetic operators;
   operating the second set of arithmetic operators to generate a real portion resulting from a complex multiplication of the real and imaginary portions of the second set of complex tap signals and the real and imaginary portions of the second set of complex tap coefficients output by the third and fourth sets of multiplexers each time the third and fourth set of multiplexers output new complex tap signals and tap coefficients.

8. A method of sharing arithmetic operators in a feedback equalizer circuit comprising a real N-tap finite impulse response filter for filtering a signal, where N is an integer greater than 3, the method comprising the steps of:
   providing a first multiplexer for receiving a first and second tap coefficient;
   providing a second multiplexer for receiving a first and second tap signal;
   providing a third multiplexer for receiving a third and forth tap signal;
   providing a fourth multiplexer for receiving a third and fourth tap coefficient;
   providing a first and second multiplier and a first summer coupled to the first and second multipliers;
   operating the first and second multiplexers to output the first tap coefficient and first tap signal, respectively;
   operating the third and fourth multiplexers to output the third tap signal and third tap coefficient, respectively;

operating the first and second multipliers to multiply the first tap coefficient with the first tap signal and the third tap coefficient with the third tap signal, to generate first and third tap signal outputs, respectively; and operating the first summer to sum the first and third tap signal outputs.

9. The method of claim 8, further comprising the steps of:

storing the sum of the first and third tap signal outputs thereby forming a first stored sum;

operating the first and second multiplexers to output the second tap coefficient and second tap signal, respectively;

operating the third and fourth multiplexers to output the fourth tap signal and fourth tap coefficient, respectively;

operating the first and second multipliers to multiply the second coefficient with the second tap signal and the fourth coefficient with the fourth tap signal, to generate second and fourth tap signal outputs, respectively;

operating the first summer to slum the second and fourth tap signal outputs; and summing the sum of the second and fourth tap signal outputs with the first stored sum to generate the output of the first through fourth taps of the real N-tap finite impulse response filter.

10. The method of claim 9, further comprising the steps of:

providing a fifth multiplexer for receiving a fifth and sixth tap coefficient;

providing a sixth multiplexer for receiving a fifth and sixth tap signal;

providing a seventh multiplexer for receiving a seventh and eighth tap signal;

providing an eighth multiplexer for receiving a seventh and eight tap coefficient;

providing a third and fourth multiplier and a second summer coupled to the first and second multipliers;

operating the fifth and sixth multiplexers to output the fifth tap coefficient and fifth tap signal, respectively;

operating the seventh and eighth multiplexers to output the seventh tap signal and seventh tap coefficient, respectively;

operating the third and fourth multipliers to multiply the fifth tap coefficient with the fifth tap signal and the seventh tap coefficient with the seventh tap signal, to generate fifth and seventh tap signal outputs, respectively; and operating the second summer to sum the fifth and seventh tap signal outputs.

11. The method of claim 10, further comprising the steps of:

storing the sum of the fifth and seventh tap signal outputs thereby forming a second stored sum;

operating the fifth and sixth multiplexers to output the sixth tap coefficient and sixth tap signal, respectively;

operating the seventh and eight multiplexers to output the eighth tap signal and eighth tap coefficient, respectively;

operating the third and fourth multipliers to multiply the sixth tap coefficient with the sixth tap signal and the eight tap coefficient with the eighth tap signal, to generate sixth and eighth tap signal outputs, respectively;

operating the second summer to sum the sixth and eight tap signal outputs; and summing the sum of the sixth and eighth tap signal outputs with the second stored sum to generate the output of the fifth through eighth taps of the real N-tap finite impulse response filter.

12. A real 4-tap finite impulse response filter for generating a filter output signal as a function of a first through fourth tap signal and a first through fourth tap coefficient, the 4-tap finite impulse response filter comprising:

a first multiplexer for receiving and selectively outputting a first and a second tap coefficient;

a second multiplexer for receiving and selectively outputting a first and a second tap signal;

a first multiplier coupled to the first and second multiplexers for multiplying the first tap signal with the first tap coefficient and the second tap signal with the second tap coefficient;

a third multiplexer for receiving a third and a fourth tap signal;

a fourth multiplexer for receiving a third and a fourth tap coefficient;

a second multiplier coupled to the third and the fourth multiplexers for multiplying the third tap signals with the third tap coefficient and the fourth tap signal with the fourth tap coefficient; and a summer coupled to the first and second multiplexers.

13. An N-tap finite impulse response filter circuit for use in a joint VSB/QAM demodulator, wherein N is an integer, the filter circuit comprising:

multiplexer means, including a plurality of multiplexers, for receiving QAM tap signals, VSB tap signals, QAM tap coefficients, VSB tap coefficients, and a modulation type signal, the multiplexer means outputting the received VSB tap signals and the received VSB tap coefficients when the modulation type signal indicates a VSB mode of operation and outputting the received QAM tap signals and the received QAM tap coefficients when the modulation type signal indicates a QAM of mode operation; and multiplier means coupled to the multiplexer means for multiplying the tap signals and the tap coefficients output by the multiplexer means, the tap coefficients and the tap signals corresponding to the same tap of the N-tap finite impulse response filter circuit being multiplied together.

14. The N-tap finite impulse response filter circuit of claim 13, further comprising:

programmable adder means, coupled to the multiplier means, for receiving the modulation type signal and for summing as a function of the modulation type selection signal the products of the multiplier means.

15. The N-tap finite impulse response filter circuit of claim 14, wherein the multiplexer means and the programmable adder means receive a feed forward/feed back control signal which controls whether the multiplexer means and programmable adder means operate in a feed forward filter mode or a feedback filter mode.

* * * * *